United States Patent [19]
Pathak et al.

[11] Patent Number: 5,946,267
[45] Date of Patent: Aug. 31, 1999

[54] ZERO POWER HIGH SPEED CONFIGURATION MEMORY

[75] Inventors: Saroj Pathak, Los Altos Hills; Glen A. Rosendale, Santa Clara; James E. Payne, Boulder Creek; Nianglamching Hangzo, San Jose, all of Calif.

[73] Assignee: Atmel Corporation, San Jose, Calif.

[21] Appl. No.: 08/978,286

[22] Filed: Nov. 25, 1997

[51] Int. Cl.⁶ .................................................. G11C 8/00
[52] U.S. Cl. .......................... 365/233; 365/221; 365/239
[58] Field of Search .............................. 365/233, 189.05, 365/221, 239

[56] References Cited

U.S. PATENT DOCUMENTS 5,086,388  2/1992  Matoba et al. ........................... 395/425
5,473,577  12/1995  Miyake et al. ........................... 365/238

Primary Examiner—David Nelms
Assistant Examiner—Hoai V. Ho
Attorney, Agent, or Firm—Thomas Schneck

[57] ABSTRACT

A serial configuration memory device comprises an architecture wherein the reading out of data and the outputting of the bitstream are performed in pipeline fashion. As a result, the device is capable of outputting a bitstream based solely on the frequency of an externally provided clock, and is not limited by the slower operating speed of the sense amp circuitry. A caching scheme is provided which allows the first byte to be pre-loaded during a reset cycle so that the device can immediately begin outputting the bitstream as soon as the reset cycle completes. In a preferred embodiment of the invention, the bitstream consists of serially accessed memory locations starting from memory location zero. In one variation, the bitstream can begin from a memory location other than memory location zero.

28 Claims, 7 Drawing Sheets

ZERO POWER HIGH SPEED CONFIGURATION MEMORY

TECHNICAL FIELD

The present invention relates to semiconductor memory devices, and more particularly to serial configuration memories.

BACKGROUND ART

Serial configuration memories are devices used to initialize programmable logic devices, such as field programmable gate arrays (FPGAs). When a device such as an FPGA powers up, each of its logic blocks must be configured for a specific logic operation and its programmable interconnects must be configured to provide routing among the logic blocks to implement the intended logic function. The configuration information takes the form of a bitstream which feeds into the FPGA and is stored in the device, where the bits define logic and routing of the FPGA elements.

A serial configuration memory is the device which contains the configuration bitstream. A serial configuration memory consists of a memory array such as a PROM (programmable read only memory) or EEPROM (electrically erasable programmable read only memory), an address counter, and supporting logic to provide programming and reset control. The address counter is tied to a clock input line and is incremented on each rising or falling edge of a clock signal. The counter output serves to address each bit of the memory array, producing a bitstream which is serially output to an FPGA.

Many of today's personal electronic devices are powered by an independent source, namely a battery, and so there is always a concern for conserving power wherever possible. The desire to minimize power consumption pervades every aspect of the design of these devices. FPGAs find use in many such devices, including laptop computers, notepad computers, and cellular telephones. Configuration memories, therefore, present an opportunity where improvements can be made to minimize power consumption.

An aspect of modern FPGAs is their ability to be reconfigured in-system. Thus, the functionality of an FPGA can be dynamically altered while the system is running. This capability provides a high degree of flexibility for the system to adapt its operation in response to external conditions. For example, in an FPGA configured as a digital filter, its filter parameters can be altered simply by loading in a different set of filter coefficients when the need to do so is detected. However, reconfiguring an FPGA in real time requires the ability to download a new configuration bitstream without imposing a delay that would detrimentally impact system functionality. Thus, high speed operation is another area for improvement in configuration memory devices.

Prior art configuration memories output their entire contents in the form of a bitstream beginning with the first location of memory. In-system reconfiguration of an FPGA, however, requires access to any one of a number of configuration bitstreams that might be contained in a configuration memory, each bitstream having its own beginning address within the memory. It is a desire, therefore, to provide a configuration memory wherein an arbitrary beginning address can be specified. More generally, it is desirous to have the capability of arbitrarily addressing the memory device.

SUMMARY OF THE INVENTION

The configuration memory device of the present invention comprises a memory array organized as N-bit data, typically eight bit bytes or sixteen bit words. An external clock signal feeds into a divide-by-N circuit to provide a trigger to initiate a memory access and to sense the contents of an accessed memory location. Sense circuitry provides parallel sensing of the N bits of the accessed memory location. In the preferred embodiment, the sense circuitry comprises N sense amps, one for each bit being sensed.

The sense circuitry is enabled when a memory location is being accessed. The sense circuitry remains enabled for the time it takes to decode a memory address and to sense the N bits in the addressed memory location. Since the sense circuitry operates on all N bits at once, the sense time is based on the speed of one sense amp. The sense circuitry includes a latch to hold the sensed data during the period of time between which the sense amps are disabled and the data is loaded into the data register.

The sense circuitry is coupled to a data register which receives the sensed bits. The bits are then serially shifted out synchronously with an external clock. In accordance with the invention, the sensed bits are loaded into the data register as the last bit of a previously stored datum is shifted out of the data register. As a result, the first bit of the sensed datum is ready to be shifted out on the next clock. Meanwhile, the next memory location is accessed and its bits are sensed. This results in the continuous output of a stream of bits at a rate equal to the frequency of the external clock. More importantly this approach decouples the operation of the sense circuitry, which is usually slower than the clock speed, from the operation of generating the bitstream output.

The device further includes means for pre-loading the data register with a first datum from memory during the power up sequence. This initializes the data register so that there is data to shift out while the next datum is accessed and sensed. In the preferred embodiment, a cache register is loaded with a datum from memory during the power up cycle, and from there the data is subsequently loaded into the data register.

In a preferred embodiment of the invention, an address counter is coupled to the divide-by-N circuit to provide an address every Nth clock. The address counter feeds into a decoder to gain access to the memory, thus providing a sequential access of the memory. In a variation of the preferred embodiment, a means for initializing the address counter is included so that reading of the memory array can begin anywhere in the array. This feature permits reading out of bitstream beginning from any location in the memory array. In yet another variation, the address counter is replaced with a means for receiving externally provided addresses. This enables an external device to produce a bitstream composed of an arbitrary sequence of memory locations.

BEST MODE OF CARRYING OUT THE INVENTION

Figure 1:
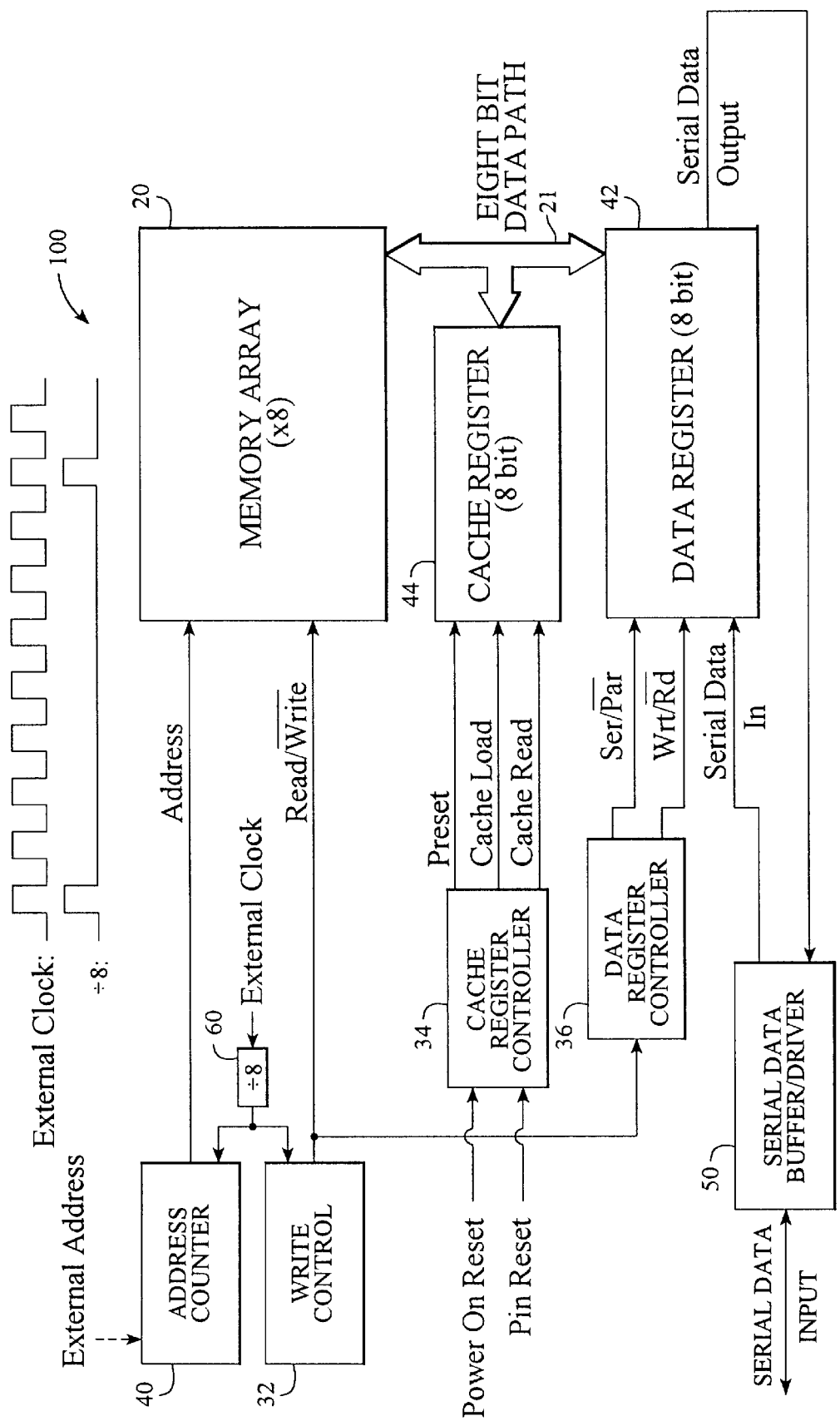
FIG. 1 is a system block diagram of the memory device in accordance with the invention.

Referring to FIG. 1, a serial configuration memory device 100 in accordance with the present invention includes a memory array 20, typically organized into an array of eight-bit bytes. Alternative data sizes for the array can be used instead, e.g. sixteen-bit words. In general, the present invention is capable of operating with N-bit data sizes, where N preferably is a power of 2.

An address counter 40 feeds into the memory array 20 which includes a decoder for decoding the address of a memory location. The address counter 40 is clocked by the output of a divide-by-eight (÷8) circuit 60. The ÷8 circuit is driven by an externally provided clock signal to provide a pulse on every eighth cycle of an EXTERNAL CLOCK. FIG. 1 shows a train of clock pulses provided by the EXTERNAL CLOCK and the resulting pulses produced by the ÷8 circuit. Thus, a stream of addresses feeds into the memory array 20 at a rate of one address every eighth clock. Again, in the general case the circuit is a divide-by-N circuit for N-bit data sizes, where an address is produced every Nth clock. A write control module 32, also driven by the ÷8 circuit, provides signaling to the memory array for read and write operations. In addition, the write control module signals a data register controller 36 to latch data read out of array 20 into a data register 42.

The memory array 20 outputs the eight bits of an accessed byte to data register 42 via a parallel eight-bit data path 21. As mentioned above, data register controller 36 operates the data register to parallel load a byte (or an N-bit datum) read out from memory 20 into data register 42; and to serially shift its eight bits out of the SERIAL DATA OUTPUT line, outputting the contents of memory 20 as a stream of bits. The SERIAL DATA OUTPUT line feeds into a serial data buffer 50 which drives the bitstream into an external device, e.g. FPGA (not shown). The serial data buffer 50 also receives data to be written into the memory array 20 to effectuate programming of the configuration memory device. Write control module 32 and data register controller 36 together operate data register 42 to serially shift data in from the SERIAL DATA INPUT and to parallel write the shifted-in data into memory 20.

The configuration memory device of the present invention further includes a cache register 44 coupled to receive a byte of data during the power-up sequence, and to load a byte previously stored in cache register 44 into data register 42 during a reset sequence. A cache register controller 34 controls the cache register to perform these operations, as will be explained below.

Figure 2A:
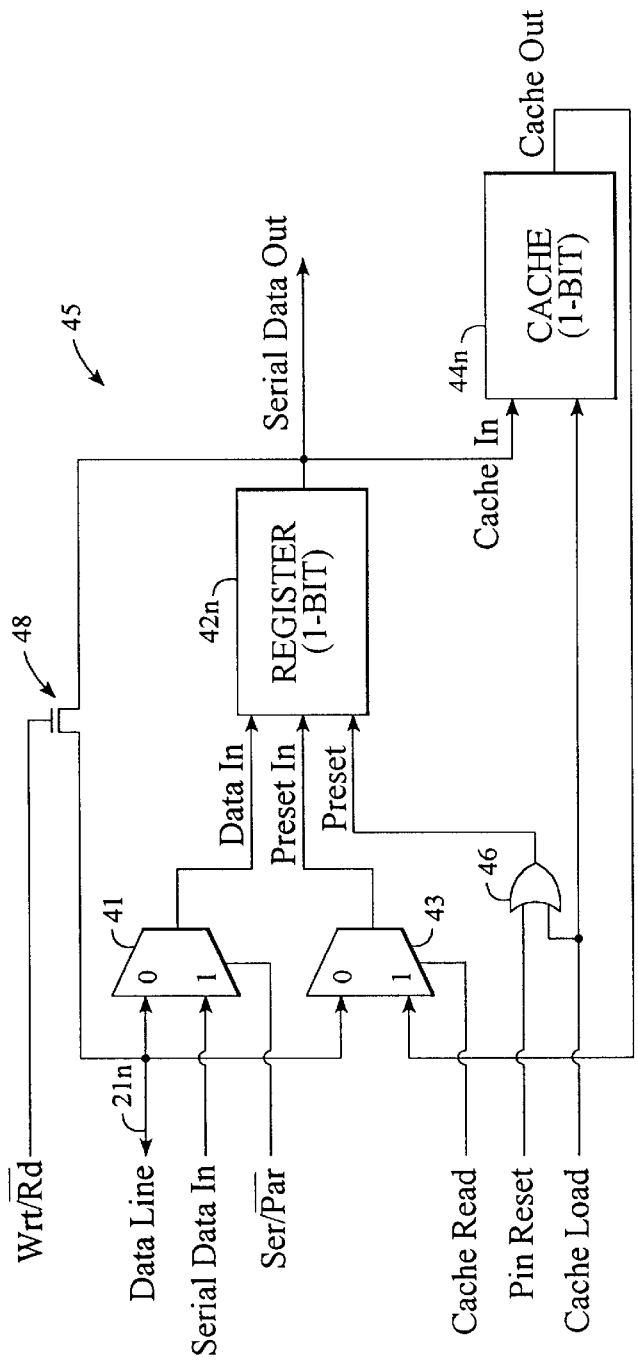
FIGS. 2A–2C and 3 illustrate the data caching scheme of the invention.
Figure 2C:
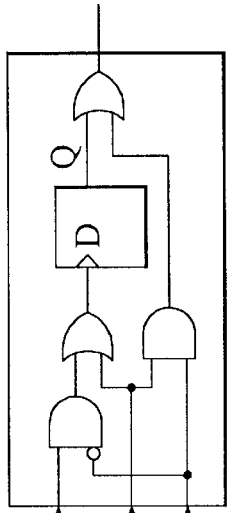
Figure 2B:
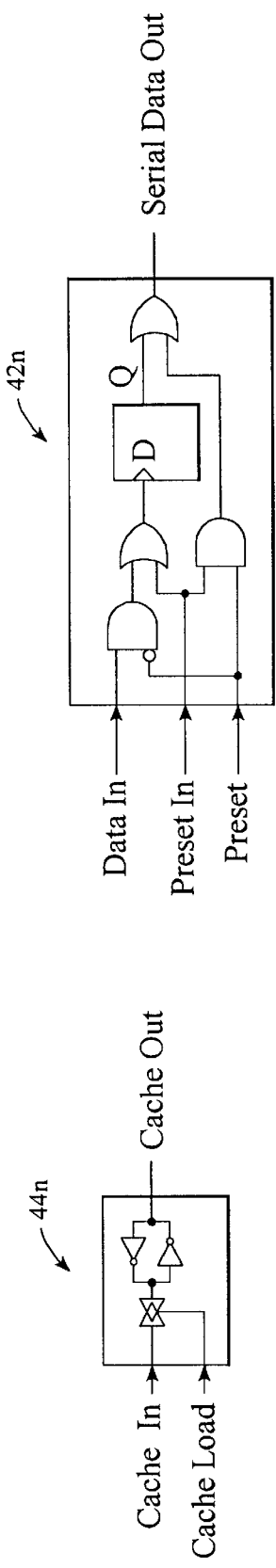

Referring now to FIG. 2A, data register 42 and the cache register 44 comprise a series of one-bit stages 45. Each stage 45 includes a one-bit register 42n and a one-bit cache latch 44n. Cache latch 44n receives its input from an output of register 42n. A CACHE LOAD control signal enables the cache latch to store the data which appears at its input line. The output of the cache latch feeds into an input of switch 43. FIG. 2B shows a typical circuit for cache latch 44n, comprising a latch circuit access which is gated by a transmission gate controlled by the CACHE LOAD signal.

Register 42n receives input from switch 41 and switch 43, and includes a PRESET control input. Switch 41 receives data from DATA LINE 21n and SERIAL DATA IN, and is switched by the SER/PAR control line. The output of switch 41 feeds into DATA IN of register 42n. Switch 43 receives data from cache latch 44n and from DATA LINE 21n, and is switched by the CACHE READ control line. The output of switch 43 feeds into PRESET IN of register 42n. Register 42n is clocked by the EXTERNAL CLOCK (not shown). The output of register 42n feeds a SERIAL DATA OUT line and as noted above feeds into cache latch 44n. In addition, the output of the register 42n is fed back to the DATA LINE 21n via pass transistor 48 which is controlled by the WRT/RD control line.

The PRESET control input is driven by the output of OR gate 46 which receives a PIN RESET signal and a CACHE LOAD signal, both originating from cache controller 34. PRESET control causes register 42n to latch data in from the PRESET IN input rather than from the DATA IN input. In addition to being latched into the register 42n, PRESET control passes the PRESET IN input directly to the output of the register. The reason for this behavior will become apparent in the explanation below. A typical circuit for the register 42n is shown in FIG. 2C.

Figure 3:
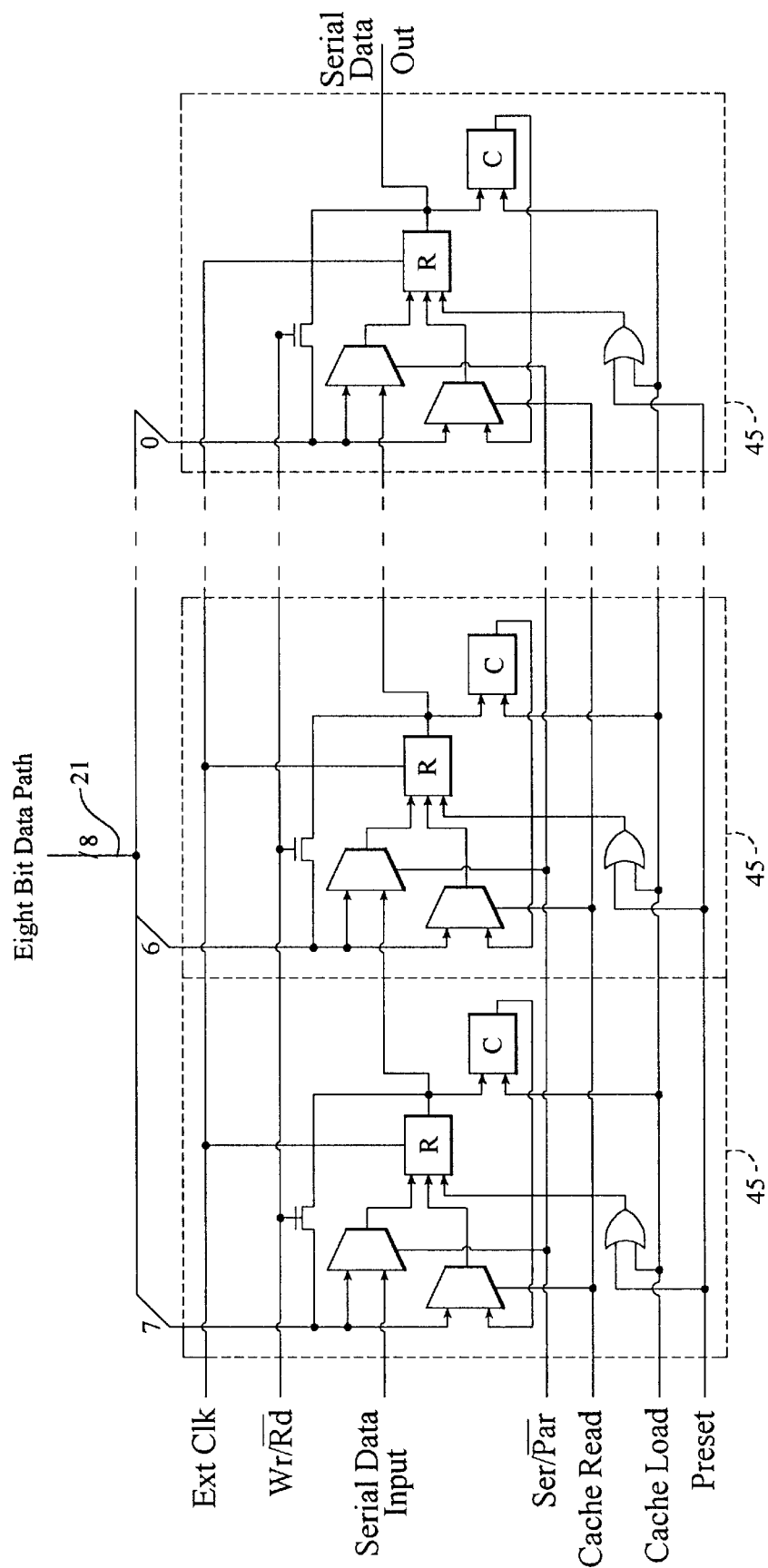

Data register 42 and cache register 44 (FIG. 1) are comprised by the coupling together of eight of the one-bit stages 45 in the manner shown in FIG. 3. For example, data register 42 is built up by coupling the SERIAL DATA OUT of one register 42n to the SERIAL DATA IN of the subsequent register. The eight-bit data path 21 from memory array 20 (FIG. 1) comprises the DATA LINE 21n of the stages 45. The SERIAL DATA OUTPUT (FIG. 1) of the data register 42 derives from the SERIAL DATA OUT line of the stage holding the least significant bit, while the SERIAL DATA INPUT of the data register is the SERIAL IN of the stage containing the most significant bit. All of the control lines are common to each of the stages.

Data register 42 and cache register 44 together perform four fundamental tasks: the data register accepts data in parallel fashion from an accessed memory location; data stored in the data register is serially shifted out on the SERIAL OUTPUT line; data to be stored in memory array 20 is serially shifted in from the SERIAL INPUT line; and data is presented in parallel fashion to eight data-in buffers (not shown) in memory array 20 when writing to a memory location.

Task 1: Loading data from an accessed memory location involves a parallel read operation. This is accomplished by asserting LO the WRT/RD and the SER/PAR control lines of each of the one-bit stages 45 comprising the data register 42. A LO on WR/RD turns off a pass transistor 48, so that the output from memory 20 via DATA LINE 21n feeds into switch 41 and 43. Also, a LO on SER/PAR switches DATA LINE 21n to DATA IN of register 42n. The PIN RESET and CACHE LOAD lines are LO so that the register clocks its data from DATA IN rather than PRESET IN.

Task 2: Serial shifting of data contained in data register 42 is accomplished by asserting a logic LO on WRT/RD and a HI on SER/PAR. WRT/RD turns off pass transistor 48 to isolate SERIAL DATA OUT from DATA LINE 21n. SER/PAR switches SERIAL DATA IN from a preceding register 42n so that each tick of the EXTERNAL CLOCK effectuates a shift propagation of the data from one register 42n to the next.

Task 3: Serially shifted input from SERIAL DATA INPUT (FIG. 1) requires asserting a HI on SER/PAR in order to serially clock data into the data register. WRT/RD is asserted LO to turn off pass transistor 48 so that the output of register 42n is isolated from DATA LINE 21n.

Task 4: Data shifted into the data register is written into memory 20 by asserting a HI on WRT/R. Since the data to be written is sitting at the output of each register 42n, turning on pass transistor 48 presents the data in parallel fashion to the data-in buffers (not shown) of memory array 20.

During the power-up (power-on reset) sequence and the externally driven reset sequence of the memory device, operation of the data and cache registers 42, 44 proceed in a different manner. Referring again to FIG. 2, during a power-on reset (POR) cycle, CACHE READ is asserted LO and CACHE LOAD is asserted HI. CACHE READ switches DATA LINE 21n to PRESET IN of register 42n. CACHE LOAD loads PRESET IN into register 42n. As explained above with respect to FIG. 2C, asserting PRESET couples PRESET IN directly to the output of the register 42n. Moreover, in the case when CACHE LOAD is asserted HI, PRESET IN is loaded into the cache latch 44n as well (see FIG. 2A and 2B). Thus, when a first byte of data (usually the byte contained in memory location 0) is sensed during the POR cycle, it is presented on the eight-bit data path 21 (FIG. 1), which feeds into each DATA LINE 21n, and is loaded into the registers 42n and the cache latches 44n comprising data register 42 and cache register 44 respectively. This operation is asynchronous, and when CACHE LOAD goes LO, data register 42 (as well as the cache register) contains the first byte. When the first clock comes along, data register 42 will have been pre-loaded with a byte and will be ready to start shifting data out.

During an externally driven reset cycle, there is not enough time to sense and load the first byte into the data register 42. Typically, a reset cycle completes in a matter of tens of nanoseconds (e.g. 20 nanoseconds), as compared to a POR cycle which requires on the order of microseconds to complete before the device is ready to output its bitstream. Recall, however, that the cache register 44 has already been pre-loaded with the first byte during the POR cycle. Thus, CACHE READ is asserted HI so that PRESET IN is switched to receive the output of the cache latch 44n. PIN RESET (via cache controller 34) is asserted HI so that register 42n loads its input from PRESET IN rather than DATA IN. Instead of accessing a memory location and sensing the byte to be loaded into the data register 42, the first byte is loaded directly from the cache register 44 during a reset cycle, an operation that can be accomplished within the time to complete the reset cycle. Again, this is an asynchronous operation, and as soon as the PIN RESET condition clears, the data register 42 holds the cached byte and is ready to be clocked out.

Figure 4:
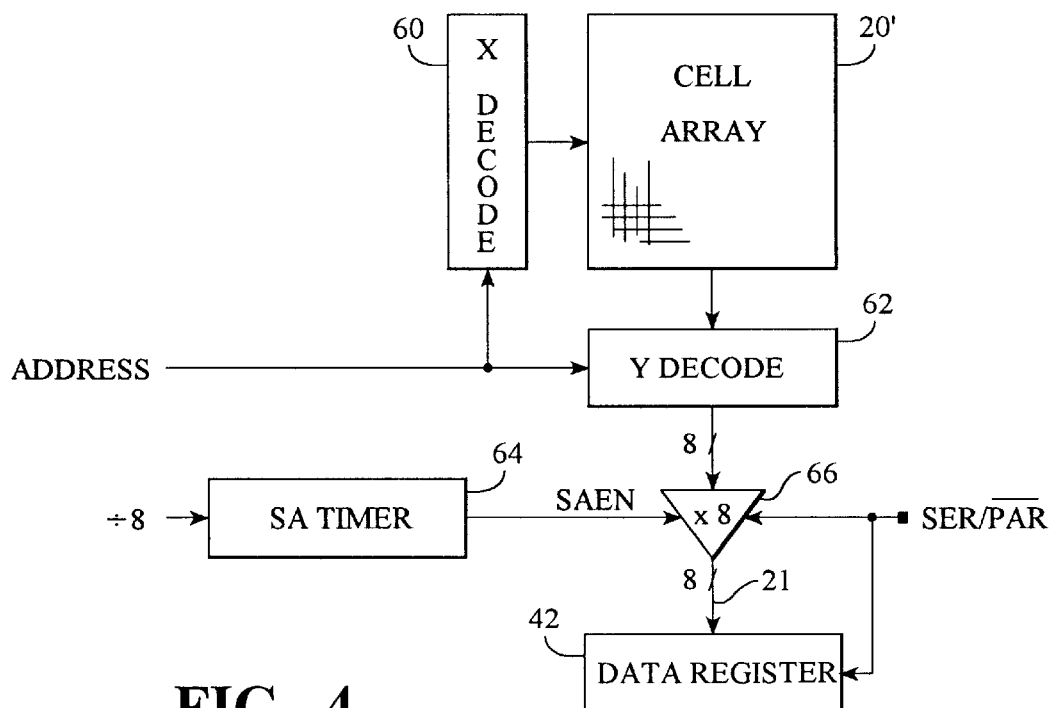
FIG. 4 is a block diagram showing the memory array of the present invention.

Referring now to FIG. 4, the memory array 20 is shown comprising a cell array 20' having a plurality of programmable memory cells, such as an array of floating gate devices. X- and Y- decoders 60, 62 receive an address and provide the necessary decoding logic to access a memory location within cell array 20'. The output of the Y-decoder feeds into sense amp circuitry 66 which comprises a series of eight sense amplifiers (FIG. 5) acting in parallel. In accordance with the present invention, the Y-decoder feeds all N bits (e.g. 8 bits) of an accessed memory location in parallel fashion into the sense amp circuitry 66, thus providing parallel sensing of the bits. The output of the sense circuitry is coupled to the data register 42 via data lines 21. A timer 64 provides an enable signal SAEN to turn on and turn off the sense circuitry, and is driven by the ÷8 clock. SER/PAR latches the read out data from the sense amps 66 into the data register 42.

Figure 5:
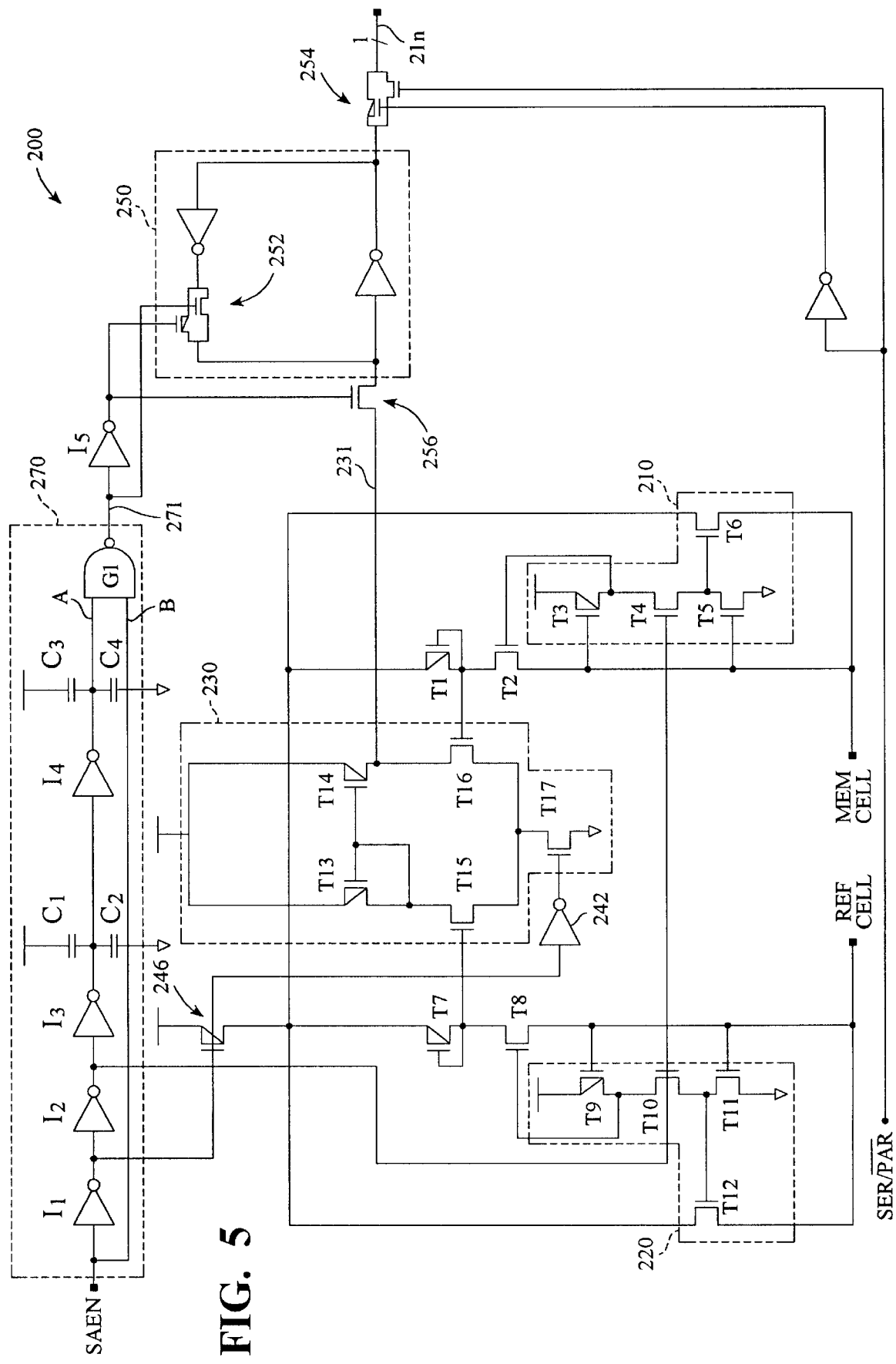
FIG. 5 is a schematic of a sense amplifier in accordance with the invention.

FIG. 5 shows each such amplifier 200, comprising sense amps 66, in greater detail. Transistors T13–T17 comprise a differential amp stage 230. On the memory cell side of the diff. amp 230 is a voltage reference section 210 and a current-to-voltage stage comprising transistors T1 and T2. Similarly on the reference cell side is a voltage reference 220 and a current-to-voltage stage comprising transistors T7 and T8. The output 231 of the diff amp (i.e. the sensed bit) feeds through pass transistor 256 to be stored in latch 250. The output of the latch is coupled to the sense amp output line 21n via transmission gate 254 which is turned on by the SER/PAR line.

The sense amp 200 further includes, in accordance with the present invention, a sense amp enabling circuit 270. The enabling circuit is driven by a sense amp enable signal SAEN derived from the timer 64 shown in FIG. 4. The enabling circuit comprises a string of inverters I1–I4, interspersed with pairs of delay capacitors C1/C2 and C3/C4. The output 271 of the enabling circuit 270 operates a transmission gate (comprised of transistor pair 252 and inverter I5) which is coupled in-line with the latch 250 in the manner shown in FIG. 5. The output 271 also drives (via inverter I5) the gate of pass transistor 256.

With respect to the enabling circuit 270, the SAEN signal feeds directly into input B of NAND gate G1 and into inverter I1. The output of inverter I1 feeds into the gate of a P-channel transistor 246 and into inverter 242. Inverter I1 turns on and off transistor 246 and inverter 242 at the same time. The output of inverter I2 switches N-channel transistors T4 and T10. The output of inverter I4 feeds into input A of NAND gate G1. Because of the delay capacitors, the signal arriving at input A is delayed relative to the signal at input B by an amount of time based upon the capacitance values of the delay capacitors and to some degree the delay of inverters I1–I4.

Operation of the sense amp 200 will now be described with reference to FIG. 5 and the timing chart of FIG. 6. Referring first to FIG. 5, as SAEN transitions from LO to HI during a power-up sequence, the signal out of inverter I1 goes LO, thus turning on transistor 246 thereby supplying $V_{cc}$ to transistors T1, T6, T7, and T12. Inverter I1 also turns on transistor T17 via inverter 242, thus enabling differential amp 230 by providing a path to ground. A short delay thereafter, the output of inverter I2 goes HI. This turns on transistors T4 and T10, thereby turning on the voltage reference stages 210, 220. At this time, the power-up sequence for the sense amp has completed. This power-up sequence guarantees a clean switchover of the sense amp from a non-powered state to a powered state, avoiding any transients which might appear at the sense amp output 21.

Figure 6:
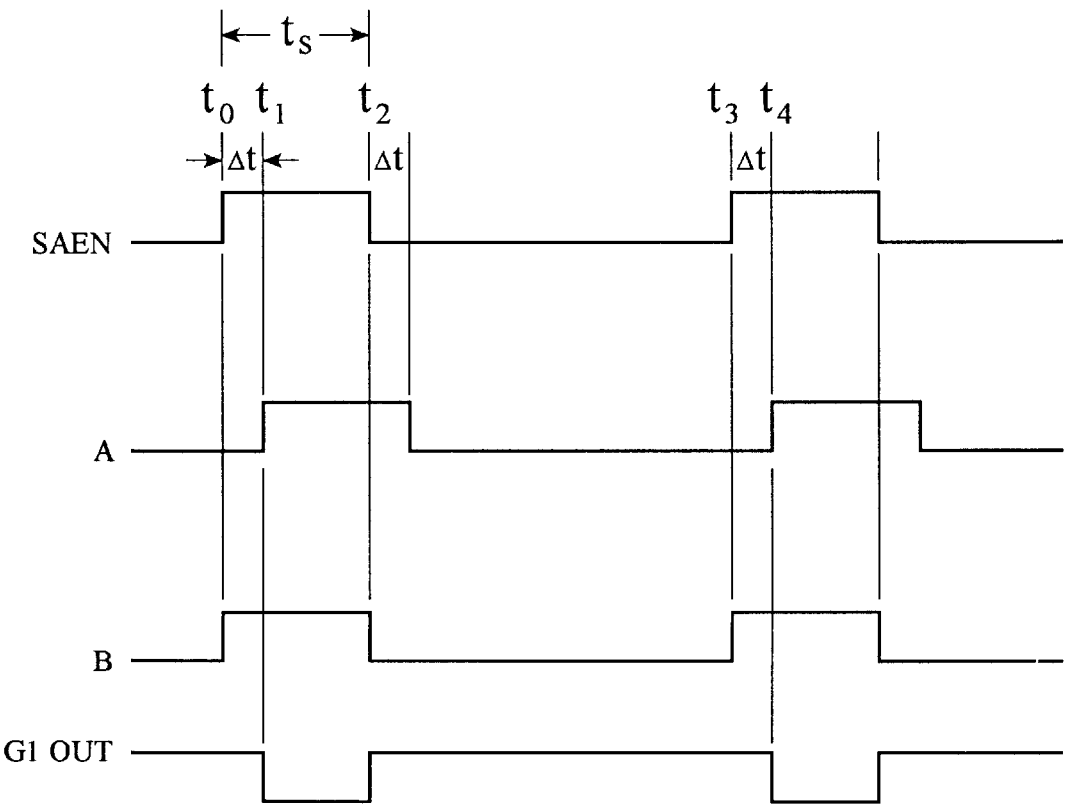
FIG. 6 is a timing diagram showing the operation of the sense amp of the present invention.

Turn now to the timing of the input signals at inputs A and B of NAND gate G1 during power-up shown in FIG. 6. Prior to time $t_0$, and for a period of time $\Delta t$ after $t_0$, NAND gate G1 is HI since A and B are both LO. Latch 250, therefore, is able to retain its state by virtue of transmission gate 252 being on. At the same time, latch 250 is isolated from the output 231 of diff. amp, since pass transistor 256 is off. Because of the delay capacitors C1–C4, the signal at input A arrives subsequent to the signal at input B and thus gate G1 remains HI until time $t_1$, $\Delta t$ units after SAEN goes HI. At $t_1$ gate G1 goes LO which turns off transmission gate 252, thus clearing the latch and disabling it. Also pass transistor 256 is turned on, thus connecting the output of diff. amp 230 to the latch. The delay path ensures that the state of the latch (and hence the previously sensed data) is retained until after the sense amp is fully powered.

Continuing, consider when the sense amp begins its power-down sequence as SAEN transitions from HI to LO. Referring back to FIG. 5, the output of inverter I1 goes HI which turns off transistor 246, thus removing $V_{cc}$ from transistors T1, T6, T7, and T12. In addition, transistor T17 is turned off (via inverter 242), thus disabling the diff. amp 230. The output of inverter I2 next goes LO which turns off transistors T4 and T10, thereby shutting down the voltage reference stages 210, 220. At this time, the power-down sequence for the sense amp has completed.

Referring to FIG. 6 at time $t_2$, the signal at the B input, being coupled directly to NAND gate G1, follows SAEN without delay. This causes G1 to transition HI as soon as SAEN goes LO. The diff. amp output 231 is latched into latch 250 by virtue of the transmission gate turning on. At the same time, pass transistor 256 is turned off so that the latch 250 is isolated from the rest of the sense amp circuitry as it is being powered down as described above. Thus, the sensed data is saved before power-down of the sense amp is complete. In addition, by de-coupling the sense amp output 231 from the latch, any transients which might occur during the power-down sequence will not corrupt the state of the latch.

Figure 7:
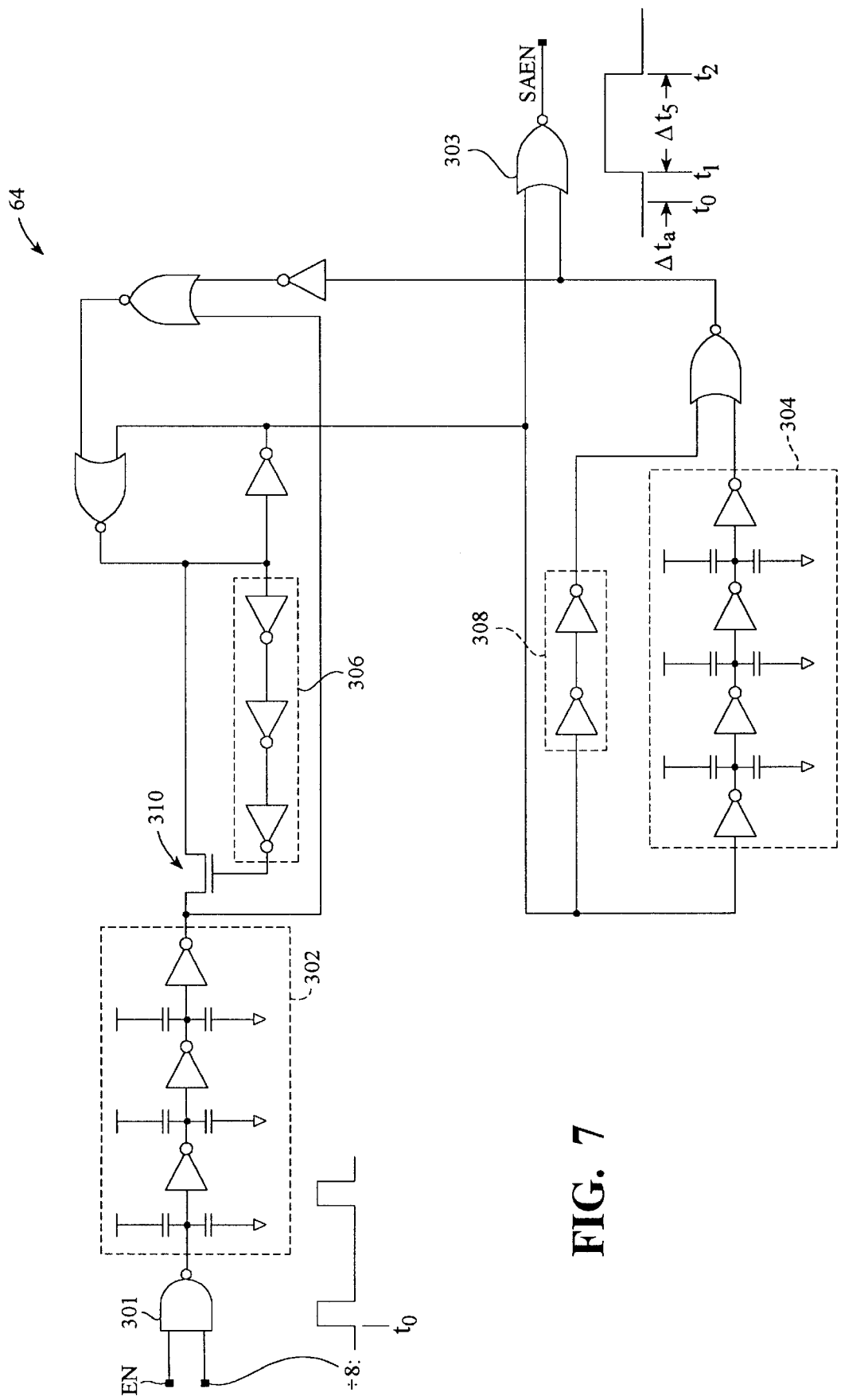
FIG. 7 illustrates a delay circuit used in conjunction with the sense amplifiers.

Refer now to FIG. 7 for additional detail of the timing circuit 64 shown in FIG. 4. The SAEN signal originates as the output of NOR gate 303 from the circuit shown in FIG. 7. NAND gate 301 enables the timing circuit when enabling signal EN goes HI. An incoming ÷8clock signal received at NAND gate 301 is delayed by a decoder delay circuit 302 for a time $\Delta t_a$. Decoder delay 302 provides a time delay sufficient to allow incrementing the address register 40 (FIG. 1) and for the address decoders 60, 62 (FIG. 4) to access a memory location, prior to actually enabling the sense amplifiers 200. An inverter chain 306 ensures a minimum delay to allow for incrementing and decoding the next address, by delaying the biasing of pass transistor 310, in a situation where the pulse width of the ÷8 clock is too short.

After a delay $\Delta t_a$, the ÷8 clock causes the output (SAEN) of NOR gate 303 to go HI, thus turning on the sense amps 200. A sense delay circuit 304 delays the ÷8 clock to ensure that the SAEN pulse remains asserted for a period of time $\Delta t_s$ sufficient for the sense amps to sense the state of a memory cell.

The relative timing between the ÷8 clock and the SAEN pulses are shown in FIG. 7. At time $t_0$, the clock arrives and is delayed by circuit 302 for a period of time $\Delta t_1$. At time $t_1$, SAEN goes HI for a period of time $\Delta t_s$, enabling the sense amps 200. At time $t_2$ SAEN goes LO, thus turning off the sense amps.

Operation of the serial configuration memory will now be discussed with reference to the timing chart of FIG. 8. As indicated in the chart, an address is produced every eighth clock (via the ÷8 clock 60, FIG. 1). Thus at a certain clock (call it clock 1), an address transition begins. As explained above, shortly after clock 1 ($\Delta t_a$, at FIG. 7) SAEN is asserted HI via timer 64 to turn on the sense amp circuitry 66. SAEN is HI for a period of time ($\Delta t_s$, FIG. 7) long enough to allow the eight bits of the addressed memory location to be sensed. SAEN then goes LO and the eight sensed bits are retained internally in the sense amp latches 250, the retained data being represented in FIG. 8 as INT DATA.

Figure 8:
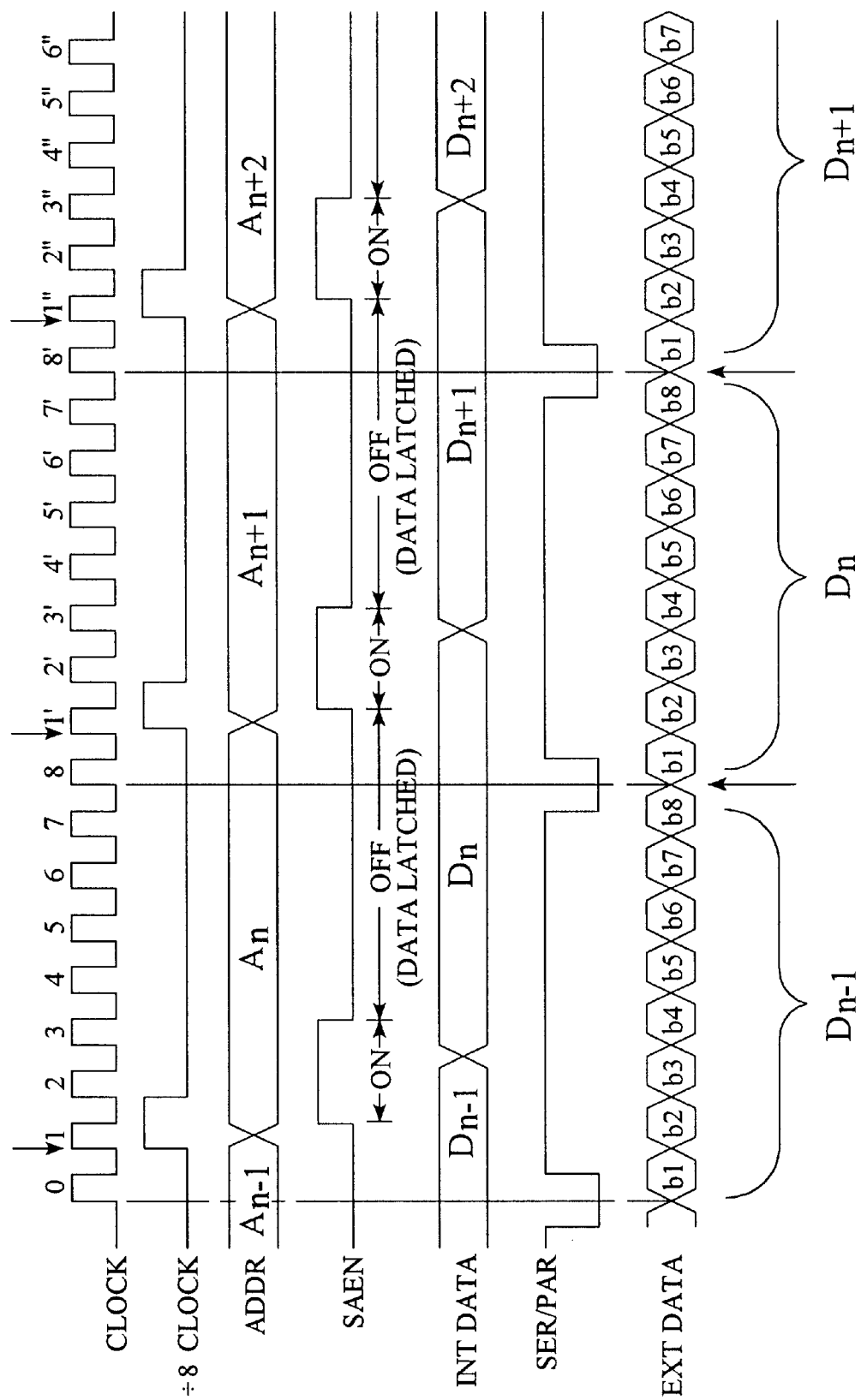
FIG. 8 is a timing diagram of the principal signals which participate in the operation of the invention.

Meanwhile, data bits from a previously read out memory location $D_{n-1}$ are being shifted out of data register 42, indicated in FIG. 8 as EXT DATA. In fact at clock 0, bit one of $D_{n-1}$ is being shifted out. Observe that for most of the time that data is being shifted out of data register 42, SER/PAR is HI, recalling from FIGS. 2A and 3 that this effectuates a right shift of the stored bits with each clock.

For clocks 1–7, bits 2–8 of $D_{n-1}$ are shifted out of the data register. At clock 7, bit 8 of $D_{n-1}$ is shifted out. Also at clock 7 SER/PAR is asserted LO for a period of time extending into clock 8. Referring once again to FIGS. 2A and 3, a LO on SER/PAR causes switch 41 to load the sensed data from the DATA LINEs 21n into the register latches 42n. In the case shown in FIG. 8 at clock 8, the data is $D_n$. Thus when clock 8 comes around, the next bit that is shifted out of the data register is the first bit of $D_n$, the memory location that was read out during clocks 1–7 (while $D_{n-1}$ was being shifted out) and stored in latches 250 of the sense amps 200.

During clocks 1'–7', the bits comprising $D_n$ are shifted out of the data register. As the timing chart shows, the process repeats. The next address $A_{n+1}$ is presented at clock 1', the sense amps are turned on to read out the eight bits of $D_{n+1}$, and latched into latches 250 just prior to turning off the sense amps. The $D_{n+1}$ bits remain in latches 250 until clock 7', at which time bit 8 of $D_n$ is shifted out and the $D_{n+1}$ bits are loaded into the data register (via SER/PAR being asserted LO), so that at clock 8', the next bit shifted out of data register 42 is the first bit of $D_{n+1}$.

A few points worth noting: First, each of the eight sense amps 200 is turned on every eighth clock, and remains on only for a period of time sufficient to allow for decoding an address and for sensing a bit. As the timing chart illustrates, this permits the sense amps to be turned off most of the time during the eight clocks required to shift out a previously read-out byte. This greatly reduces the steady state current drawn by the sense amps, representing a significant reduction in power consumption.

Second, the resulting bitstream output is synchronous with the external clock. More importantly, the output rate of the bitstream is independent of the speed of operation of the sense amps. This is due to the pipeline processing technique used in the present invention. As the timing chart shows, the memory location being read out at any one time is always one location ahead of the memory location whose bits are being output. A memory location is always being 'pre-fetched' while a previously 'fetched' location is being output. This overlapping of the read out operation and the bitstream output operation de-couples the bitstream rate from the speed of the sense amps. Thus, the rate of the bitstream is no longer limited by the speed of the sense amp, as in prior art designs. Rather, the bit rate is a function only of the external clock frequency.

Third, this architecture is easily scaled up for data sizes larger than eight-bit data. For example, a sixteen-bit data path can be accommodated simply by providing additional sense amps. The relative timing would remain unchanged from that shown in FIG. 8. Thus, for higher clock frequencies, where conceivably the sense time might approach the time it takes to serially output eight bits, extending the data size to sixteen bits would provide a wider window of time during which data can be sensed.

FIG. 1 also shows a variation of the embodiment of the present invention. In this variation, the address counter 40 includes an input shown in phantom for receiving an initial address from an external source. This allows pre-setting the address counter to a memory location other than memory location zero so that the bitstream can begin from anywhere in the memory array 20. This is useful with reconfigurable FPGAs, where multiple configuration bitstreams may be stored in the configuration memory so that any one configuration can be sent to the FPGA at runtime.

We claim:

1. A memory device comprising:
   a single data pin for outputting a datastream of bits;
   a clock pin for receiving clock pulses;

a memory array organized into a plurality of N-bit data, and having a decoder for providing access to a memory location in the memory array;

means for accessing a memory location every Nth clock pulse;

sense circuitry coupled to sense, in a parallel manner, the N bits of an accessed memory location;

means for momentarily enabling the sense circuitry for a period of time sufficient to sense the N bits of a memory location;

an N-bit data register coupled to receive N bits from the sense circuitry, the data register including means for shifting out a bit on each clock pulse;

means for loading N bits from the sense circuitry into the data register in response to shifting the Nth bit out of the data register;

means for pre-loading a datum into the data register during a power-up cycle;

whereby a datum of memory is accessed and sensed during the same time that the N bits of a previously accessed datum of memory contained in the register means are shifted out, the memory access/sensing operation and the data output operation occurring in pipeline fashion so that the bit rate of the bitstream is independent of the speed of operation of the sense circuitry.

2. The memory device of claim 1 further including a cache register and means for loading a datum into the cache register during the power-up sequence and means for transferring data from the cache register into the data register during a reset sequence.

3. The memory device of claim 1 wherein the sense circuitry includes N sense amps.

4. The memory device of claim 1 wherein the means for accessing includes a divide-by-N circuit, the divide-by-N circuit coupled to receive the clock pulses to produce a pulse every N clocks.

5. The memory device of claim 4 wherein the means for accessing includes an address counter coupled to the divide-by-N circuit to produce a sequence of consecutive memory addresses, the counter being coupled to the decoder to produce a bitstream which is composed of a sequence of consecutive memory locations.

6. The memory device of claim 5 wherein the address counter includes means for loading the initial address into the counter, so that the bitstream can begin from any location in the memory array.

7. The memory device of claim 1 wherein the means for accessing includes means for receiving memory addresses from a source external to the memory device, the means for receiving coupled to the decoder to produce a bitstream composed of a sequence of arbitrary memory locations.

8. The memory device of claim 1 wherein the means for momentarily enabling the sense amplifiers includes a trigger circuit coupled to assert an enabling pulse in response to the means for accessing a memory location, a timing circuit coupled to de-assert the enabling pulse after the expiration of the period of time needed to sense the N bits of a memory location.

9. The memory device of claim 8 wherein the trigger circuit includes a delay circuit to assert the enabling pulse after the memory location has been accessed.

10. The memory device of claim 1 wherein N is a power of 2.

11. The memory device of claim 10 wherein N is eight.

12. The memory device of claim 10 wherein N is sixteen.

13. In a memory device, a method of outputting the data in a memory array at a rate of one bit per period of a clock signal, comprising:

loading a data register with a first datum from the memory array during a power up sequence;

serially shifting out the datum contained in the data register in synchrony with the clock signal, thereby creating a serial bitstream;

before the last bit of the datum contained in the data register is shifted out, reading out a next datum in the memory array and loading the bits of the next datum into the data register in parallel fashion; and repeating the steps of shifting and accessing for other data in the memory array;

whereby the next datum is ready to be serially shifted out as soon as the last bit of the datum contained in the data register is shifted out, so that the rate of the bitstream is not limited by the time for reading out a datum from memory, but rather is equal to the period of the clock signal.

14. The method of claim 13 further including loading the first datum into a cache register during the power up sequence and loading data contained in the cache register into the data register during a reset sequence.

15. The method of claim 13 wherein the step of reading out a next datum includes:

producing the address of the next datum;

decoding the address of the next datum; and sensing the N bits of the next datum, including turning on sense amplifiers to simultaneously sense each bit and turning off the sense amplifiers after expiration of a period of time sufficient to ensure that each bit has been sensed.

16. The method of claim 15 wherein the sense amplifiers are turned on subsequent to the step of decoding, and the period of time includes the time to sense one bit of the next datum.

17. The method of claim 15 further including storing the sensed bits in a latch prior to turning off the sense amplifiers.

18. The method of claim 17 wherein the step of producing the address of the next datum is a step of incrementing an address counter; whereby the memory array is output sequentially.

19. The method of claim 17 wherein the step of producing the address of the next datum includes receiving an address from a source external to the memory device; whereby the contents of the memory array may be output in a non-sequential manner.

20. The method of claim 13 further including receiving an address for the memory location of the first datum, whereby the memory array can be read out beginning at a location other than the first memory location.

21. In a memory array organized as a plurality of N-bit data, a method of reading out the memory array, comprising the steps of:

(a) shifting out the N bits of a previously accessed memory location contained in a data register, one bit at a time, the previously accessed memory location having a first address;

(b) during the step of shifting in step (a), accessing a subsequent memory location including decoding the address of the subsequent memory location and sensing the N bits contained in the subsequent memory location, the subsequent memory location having a second address different from the first address;

(c) loading into the data register the N bits of the subsequent memory location senses in step (b) before the last bit of the previously accessed memory location is shifted out of the data register;

(d) repeating steps (a)–(c) for additional subsequent memory locations.

22. The method of claim 21 wherein the additional subsequent memory locations are sequentially ordered.

23. The method of claim 21 further including, subsequent to sensing the N bits of a memory location, powering down sense amplifiers used to do the sensing, whereby the sense amplifiers are powered down for most of the time during which the bits of the previously accessed memory location are shifted out of the data register.

24. The method of claim 21 further including, prior to step (a), storing the contents of the first memory location of the memory array into a memory cache during a power-up cycle, and loading the contents of the cache into the data register during a reset cycle.

25. The method of claim 24 wherein the memory array is sequentially accessed.

26. The method of claim 21 further including, prior to step (a), specifying a starting memory address and storing the contents thereof into a memory cache during a power-up cycle, and loading the contents of the cache into the data register during a reset cycle.

27. The method of claim 21 further including turning on sense amplifiers for sensing the contents of a memory location, subsequent to the step of decoding a memory address.

28. The method of claim 27 further including turning off the sense amplifiers after sensing the contents of a memory location.

* * * * *